United States Patent [19]

Sato

[11] 4,417,207

[45] Nov. 22, 1983

[54] CIRCUIT FOR INJECTING SIMULATING-NOISE SIGNALS IN A POWER LINE

[75] Inventor: Yoshiro Sato, Tokyo, Japan

[73] Assignee: Tohoku Metal Industries, Ltd., Sendai, Japan

[21] Appl. No.: 243,458

[22] Filed: Mar. 13, 1981

[51] Int. Cl.$^3$ .............................................. H03K 3/53
[52] U.S. Cl. ................................ 324/158 R; 307/108; 331/78; 340/310 R
[58] Field of Search .......................... 331/78; 455/226; 340/310 R, 310 A; 307/72, 108; 324/158 R

[56] References Cited

U.S. PATENT DOCUMENTS

| | | | |
|---|---|---|---|
| 2,385,673 | 9/1945 | Woodworth | 340/310 R |
| 3,657,555 | 4/1972 | Hoffman | 307/108 |
| 3,909,821 | 9/1975 | Jagoda et al. | 340/310 R |

OTHER PUBLICATIONS

Griffing, "A High Voltage Pulse Generator for Acoustoelectric Studies", Review of Scientific Instruments, vol. 45, No. 7, Jul. 1974, pp. 964–965.

Primary Examiner—Siegfried H. Grimm
Attorney, Agent, or Firm—Posnack, Roberts, Cohen & Spiecens

[57] ABSTRACT

A simulated-noise signal is injected in the power line of equipment under test without loss of AC power by the use of a series resonance circuit having a resonance frequency equal to the frequency of the AC power supply. The series resonance circuit is connected in the power line in parallel with the equipment, and a capacitor is connected to the power line in parallel with the series resonance circuit and the equipment. A switching element is used to short-circuit the resonance circuit when noise simulation is not carried out. For the simulation of lightening strikes the circuit further comprises a simulated-noise signal generator including a capacitor charged by a DC power supply, a first switching element to discharge the charge of the capacitor to the equipment, and a second switching element for establishing a by-pass of the discharging current. By closing the second switching element after the first switching element is closed, a square-wave signal is fed to the equipment. In order to simulate ringing-surge signals, the circuit includes a generator to generate a damped-wave signal similar to a ringing signal. This generator has a capacitor charged by a DC power supply, a switching element for discharging the charge of the capacitor to the equipment, and an inductance coil connected to the discharging circuit. When the switching element is closed, a damped-wave signal is fed to the equipment.

8 Claims, 12 Drawing Figures

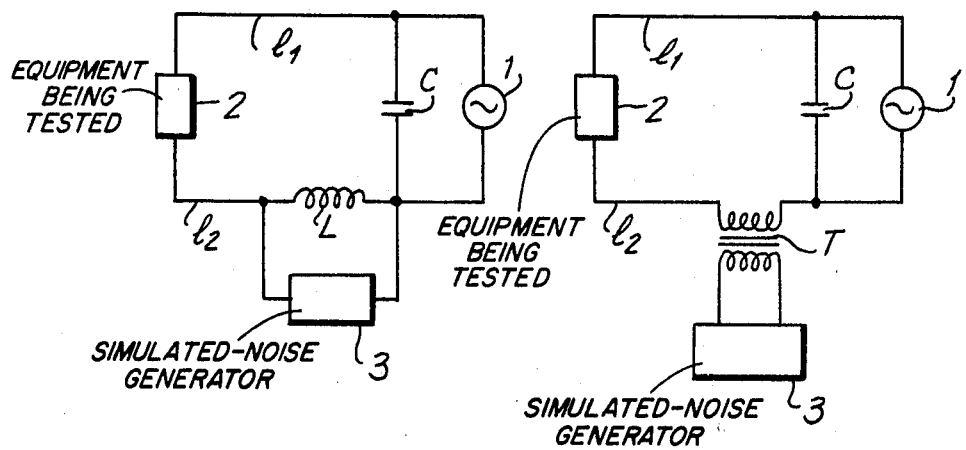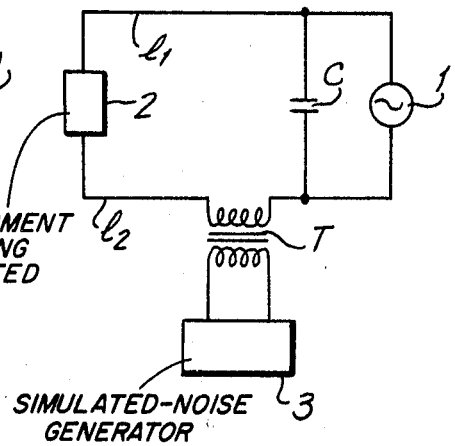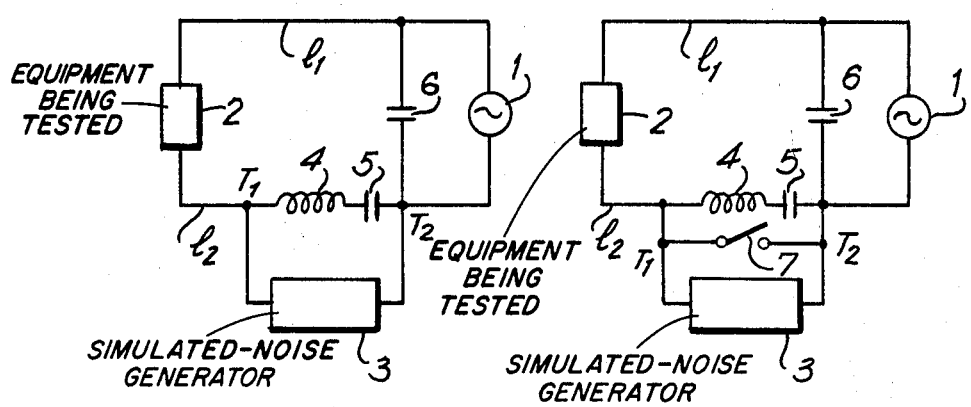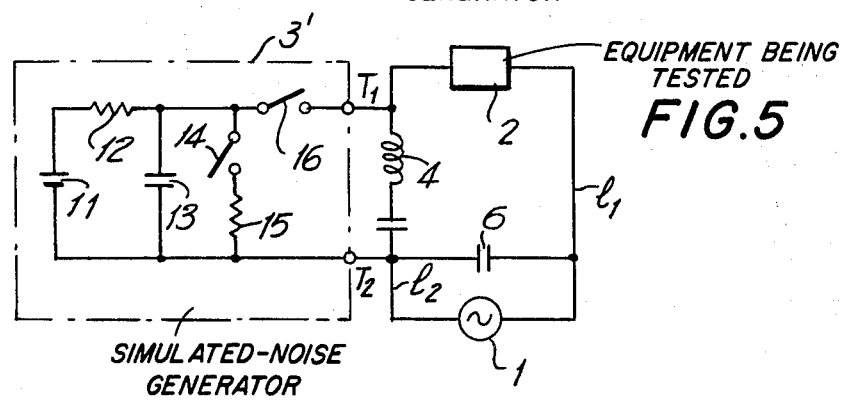

CIRCUIT FOR INJECTING SIMULATING-NOISE SIGNALS IN A POWER LINE

BACKGROUND OF THE INVENTION

This invention relates to noise simulators and, in particular, to injection of simulated-noise signals in the power line of electrical equipment under test and to generators for generating simulating-noise signals, such as a square wave for lightening strike simulation and a damped wave for ringing surge simulation.

Certain electrical or electronic equipment such as data processors and the like are sensitive to power-line noise such as voltage dips and high-frequency transients conducted through the power line, and are subject to malfunction due to the power-line noise. In order to evaluate the sensitivity of equipment to power-line noise, noise simulators are used which artificially produce power-line noise to supply the same to equipment under test through their power lines.

Such a noise simulator is disclosed in "Noise Simulators Help Find Peril in Power-line Defects" described by Mr. M. L. Tandon in Electronics, Mar. 7, 1966, pp. 117–121. In the noise simulator disclosed therein, power-line disturbances such as voltage dips and high-frequency transient noises are generated for evaluation of electrical equipment with such noise.

Thereafter, it has been noted that low-frequency surge noises such as lightening strikes and ringing surges also plague sensitive equipment such as data processors. Lightening strikes or surge noises are conducted to equipment through the power line and may defeat or erroneously operate the equipment.

Ringing surges are low-frequency damped-wave noises due to turn-on or -off of AC power to other electrical devices having inductance or capacitance such as electric motors, transformers, phase-advance condensers and the like.

For simulation of lightening strikes and ringing surges, noise simulators are desired to generate simulated lightening strikes and simulated ringing surges.

In noise simulators, a filter having an inductance coil and a capacitor is used in the power line of the equipment under test. AC power current always flows through the inductance coil to cause a voltage drop. In certain cases, a transformer is used in place of the inductance coil to inject simulated-noise signals therethrough. However, the use of a transformer is not desired for the injection of high-energy signals because a large transformer must be used.

SUMMARY OF THE INVENTION

It is an object of this invention to provide a noise simulator wherein simulated-noise signals are injected in the power line of equipment under test without AC power loss and without the use of a transformer.

It is another object of this invention to provide a noise simulator wherein a square wave signal is generated and injected in the power line of equipment for lightening-strike simulation, without AC power loss and without the use of a transformer.

It is still another object of this invention to provide a noise simulator wherein a damped-wave signal is generated and injected in the power line of equipment for ringing-surge simulation, without AC power loss and without the use of a transformer.

It is yet another object of this invention to realize the above mentioned objects with simple circuit formations and low cost.

According to this invention, a noise simulator is provided which comprises means for generating a simulated-noise signal. Series resonance means, having the resonance frequency equal to a frequency of the AC power, is connected in the AC power line in series with the equipment under test. Capacitor means are connected to the AC power line in parallel with the series resonance means and the equipment. The output of the signal generating means is connected across the series resonance means.

In the arrangement, the simulated-noise signal is fed to the equipment through the capacitor means and the power line. Since the series resonance means has a resonance frequency equal to the frequency of the AC power, voltage drop of AC power is not produced by the use of the noise simulator.

The series resonance means comprises inductance coil means and capacitor means. Switching means may be connected across the series resonance means. When it is not required to inject a simulated-noise signal on the power line, the switching means is turned on i.e. closed to short-circuit across the series resonance means.

For lightening-strike simulation, the simulated-noise generating means is a square-wave signal generator. It comprises DC power supply means. First resistor means and capacitor means are connected to the DC power supply means in series with one another. A circuit branch including serially connected first switching means and second resistor means is connected across the capacitor means. Second switching means are connected at one end to one end of the circuit branch.

Inductance coil means may be connected in the circuit branch in series with the first switching means and the second resistor means. Variable resistor means may be connected between the other end of the second switching means and the other end of the circuit branch.

In the arrangement, a square wave signal is present between the other end of the second switching means and the other end of the circuit branch by turning on the first switching means, with delay, after turning on the second switching means.

In another aspect of this invention, the simulated-noise generating means comprises a damped-wave signal generator for ringing-surge simulation. The damped-wave signal generator comprises DC power supply means and resistor means. A circuit branch including serially connected capacitor means and inductance coil means, is connected across the DC power supply means and the resistor means. Switching means is connected to one end of the circuit branch.

Variable resistor means may be connected between the other end of the switching means and the other end of the circuit branch.

In the arrangement of the damped-wave signal generator, the capacitor means is charged by the DC power supply means, and is discharged by turning off i.e. opening the switching means so that a damped-wave signal is injected in the power line.

Further objects, features and other aspects of this invention will be understood from the following description of preferred embodiments of this invention referring to the drawings annexed hereto.

BRIEF DESCRIPTION OF THE DRAWINGS

FIG. 1 is a circuit diagram of a known circuit arrangement for injecting a simulated-noise signal in the power line of electrical equipment under test;

FIG. 2 is a circuit diagram of another known noise simulator;

FIG. 3 is an embodiment of this invention for injecting a simulated-noise signal in the power line of electrical equipment under test;

FIG. 4 is a modification of the circuit arrangement of FIG. 3;

FIG. 5 is a noise simulator of an embodiment according to this invention for lightening-strike simulation;

DETAILED DESCRIPTION OF PREFERRED EMBODIMENTS

Figure 6:
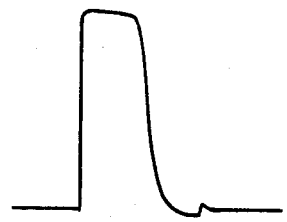
FIG. 6 shows a waveform of a square-wave signal fed to the equipment in FIG. 5.

Referring to FIG. 1, an AC power supply 1 is connected to equipment 2. For noise simulation of equipment 2, a known noise simulator comprises a generator 3 for generating a simulated-noise signal. An inductance coil or a choke coil L is connected in power line $l_2$ in parallel with generator 3, and a capacitor C is connected between power lines $l_1$ and $l_2$ to be in parallel with equipment 2 and inductance coil L. The output of generator 3 is connected across inductance coil L.

In the arrangement, the signal from generator 3 is injected into lines $l_1$ and $l_2$ through capacitor C and fed to equipment 2. AC power is also fed to equipment 2 through power lines $l_1$ and $l_2$. However, since AC power always flows through inductance coil L, a voltage drop is produced at inductance coil L.

In another known arrangement, a transformer T is used in place of inductance coil L, as shown in FIG. 2. The output of generator 3 is coupled with the primary winding of transformer T and the secondary winding of transformer T is connected in series with equipment 2 in power line $l_2$. The simulated noise is thus injected in the power line through the transformer.

In the use of a transformer for signal injection, a large transformer is disadvantageously required for injection of a high-energy signal.

Lightening strike has a high voltage. Ringing surge due to turn-on or -off of inductive or capacitive electrical devices is also high in energy.

Accordingly, the arrangement of FIG. 2 is not suitable for the injection of simulated lightening strikes or simulated ringing surges in the power line of the equipment under test.

This invention provides arrangements adaptable for injection of high-energy signals in the power line of the equipment without energy loss and without AC power loss.

Referring to FIG. 3, an embodiment of this invention comprises a series resonance circuit having a resonance frequency equal to the frequency of an AC power supply 1. The series resonance circuit includes an inductance coil 4 and a capacitor 5 serially connected in the power line $l_2$ for feeding AC power from power supply 1 to equipment 2. A capacitor 6 is connected between power lines $l_1$ and $l_2$ in parallel with equipment 2 and series resonance circuit 4-5.

A simulated-noise signal generator 3 is connected across series resonance circuit 4-5 to inject the noise signal at both sides $T_1$ and $T_2$ of the resonance circuit in the power line. The signal injected is fed to equipment 2 through capacitor 6 and power lines $l_1$ and $l_2$. AC power is also fed to equipment 2 through the series resonance circuit. However, since the series resonance circuit has a resonance frequency equal to the frequency of the AC power, AC power is fed to equipment 2 without any power loss at the resonance circuit.

A switching element 7 such as a mechanical switch or an electrical switching element may be connected in parallel with the resonance circuit 4-5 and across the resonance circuit 4-5, as shown in FIG. 4. When no simulated-noise signal is required to be injected onto the power line, switching element 7 is turned on to short-circuit the resonance circuit 4-5. As a result, equipment 2 is directly connected to AC power supply 1 so that power loss is reliably removed.

For lightening-strike simulation, a square-wave signal generator 3' is used to replace simulated-noise signal generator 3 in FIGS. 3 or 4, as shown in FIG. 5.

Referring to FIG. 5, a resistor 12 and a capacitor 13 are connected to a DC power supply 11 in series with one another. Switching element 14 and a resistor 15 are serially connected across capacitor 13. Another switching element 16 is connected between an output terminal $T_1$ and a common connection point between resistor 12 and capacitor 13. The other end of capacitor 13 is connected to the other output terminal $T_2$. The output terminals $T_1$ and $T_2$ are connected to both sides of the series resonance circuit 4-5 in the power line $l_2$, similar to FIGS. 3 or 4, so that the generated square wave may be injected in the power line.

In the arrangement, capacitor 13 is charged by DC power supply through resistor 12. When switching element 16 is turned on, a discharge current of capacitor 13 is fed to the power line from output terminals $T_1$ and $T_2$ through switching element 16. Thereafter when switching element 14 is turned on, the residual charge of capacitor 13 is discharged through resistor 15, so that feed of the discharge current to the power line is stopped. Accordingly, a square-wave signal is injected in the power line and lightening-strike simulation of the equipment can be performed.

FIG. 6 illustrates a square waveform of a signal injected in the power line from the generator shown in FIG. 5.

As will be understood from the above description, the width of the square-wave signal is defined by the delay of turn-on of switching element 14 from turn-on of switching element 16. Therefore, the width is not varied in relation to variation of the load. Accordingly, a square-wave signal of a predetermined width can be stably and reliably provided to the equipment.

Resistor 15 serves for protecting switching element 14 from passage of a large current flowing therethrough. For improving the protection, an inductance coil 17 is also used in series with resistor 15, as shown in FIG. 7.

Figure 7:
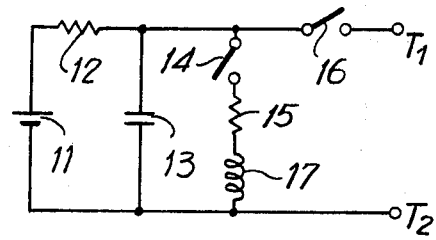
FIG. 7 is a circuit diagram of a modified generator in FIG. 5.

In the modification shown in FIG. 7, inductance coil 17 prevents a large current from suddenly flowing through switching element 14 at a time when switching element 14 is turned on.

Figure 8:
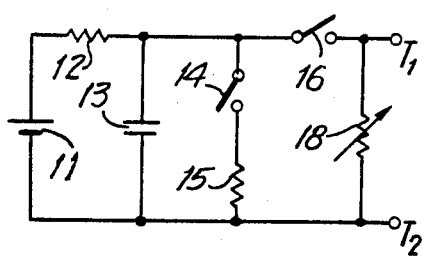
FIG. 8 is a circuit diagram of another modified square-wave signal generator.

Referring to FIG. 8, another modification is shown, wherein a variable resistor 18 is additionally used in the generator shown in FIG. 5. Variable resistor 18 is connected between output terminals $T_1$ and $T_2$ to control the signal voltage generated so that variation of the amplitude of the signal generated due to connection of a different load may be compensated.

Figure 9:
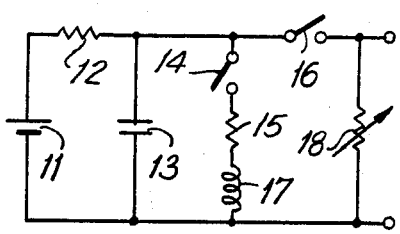
FIG. 9 is a circuit diagram of a further modification of the square-wave generator.

As shown in FIG. 9, a similar variable resistor 18 may be additionally used in the generator of FIG. 7.

In another aspect of this invention, a damped-wave signal generator is used as generator 3 in FIGS. 3 or 4, for ringing-surge simulation of the equipment.

Figure 10:
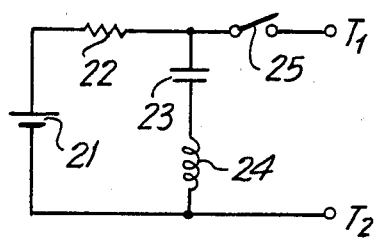
FIG. 10 is a circuit diagram for generating a damped-wave signal.

Referring to FIG. 10, the generator shown has a DC power supply 21. A capacitor 23 and an inductance coil 24 are serially connected to DC power supply 21 through a resistor 22. One end of the series circuit of capacitor 23 and inductance coil 24 is connected to an output terminal $T_1$ through switching element 25 such as a mechanical switch or an electrical switching element. The other end of the series circuit is connected to the other output terminal $T_2$. Output terminals $T_1$ and $T_2$ are connected to both sides of series resonance circuit 4–5 in FIGS. 3 or 4, so that a damped-wave signal is injected in the power line.

In the arrangement, capacitor 23 is charged by DC power supply 21 through resistor 22 and inductance coil 24. When switching element 25 is closed, the charge of capacitor 23 is discharged to the equipment through the power line, switching element 25 and inductance coil 24. The discharge current vibrates at a frequency determined by the inductance of coil 24, capacitance of capacitor 23 and the impedance of the equipment, and its amplitude is attenuated at a rate determined by the impedance of the equipment. Accordingly, a damped-wave signal is fed to the equipment from the generator so that ringing-surge simulation of the equipment may be performed.

Figure 11:
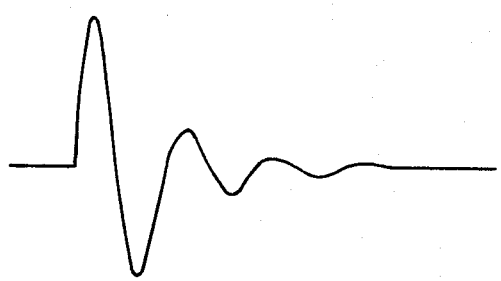
FIG. 11 shows a waveform of a damped signal fed from the generator in FIG. 10 to the equipment.

An example of a waveform of the damped-wave signal fed to the equipment from the generator of FIG. 10 is illustrated in FIG. 11.

Figure 12:
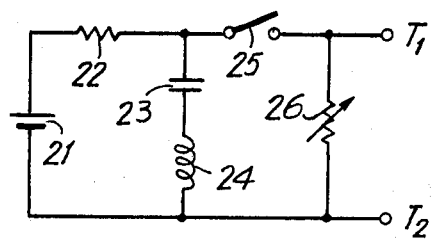
FIG. 12 is a circuit diagram of a modified damped-wave signal generator.

In order to control the attenuating rate of the generated signal, a variable resistor 26 may be connected between output terminals $T_1$ and $T_2$, as shown in FIG. 12. The variation of the attenuating rate due to the impedance difference of tested equipment can be compensated by adjusting variable resistor 26.

According to this invention, a simulated-noise signal can be readily injected in the power line of the equipment under test, without energy loss, in addition to no loss of AC power fed to the equipment.

Simulated lightening-strike signals can be reliably generated and injected on the power line so that lightening-strike simulation may be carried out with a high reliability.

Furthermore, simulated ringing-surge signal can be also generated so that a reliable simulation of the equipment to ringing surge may be performed.

What is claimed is:

1. A circuit for injecting simulated-noise signals in an AC power line of electrical equipment under noise-simulating test, which comprises:

series resonance means having a resonance frequency equal to the frequency of the AC power supply and connected in said AC power line to be in series with said electrical equipment;

a capacitor means connected to said AC power line in parallel with the serial connection of said electrical equipment and said series resonance means; and means for generating a simulating-noise signal, the output of which is connected across said series resonance means.

2. A circuit as claimed in claim 1, which further comprises switching means connected in parallel with said series resonance means.

3. A circuit as claimed in claim 1, wherein said series resonance means comprises inductance coil means and capacitor means connected in series with said coil means.

4. A circuit as claimed in claim 1, wherein said simulated-noise signal generating means comprises a square-wave generating means comprising DC power supply means, first resistor means and capacitor means connected to said DC power supply means in series with one another, a circuit branch including first switching means and second resistor means which is connected in series with said first switching means and connected across said capacitor means, second switching means one end of which is connected to one end of said series circuit branch, said first switching means being closed after closing said second switching means so that a square wave is produced between the other end of said second switching means and the other end of said circuit branch.

5. A circuit as claimed in claim 4, wherein said circuit branch further comprises inductance coil means in series with said first switching means and said second resistor means.

6. A circuit as claimed in claim 4 or 5, which further comprises variable resistor means connected between the other end of said second switching means and the other end of said circuit branch.

7. A circuit as claimed in claim 1, wherein said simulated-noise signal generating means comprises damped-wave generating means comprising DC power supply means, resistor means one end of which is connected to said DC power supply, a circuit branch including capacitor means and inductance coil means which is connected in series with said capacitor means and connected across said DC power supply means and said resistor means, and switching means one end of which is connected to one end of said circuit branch, said switching means being closed so that a damped wave is produced between the other end of said switching means and the other end of said circuit branch.

8. A circuit as claimed in claim 7, which further comprises variable resistor means connected between the other end of said switching means and the other end of said circuit branch.

* * * * *